(12) United States Patent
Lu et al.

(10) Patent No.: US 8,536,899 B1
(45) Date of Patent: Sep. 17, 2013

(54) CALIBRATION CIRCUIT APPARATUS AND METHOD

(75) Inventors: Cho-Ying Lu, Hillsboro, OR (US); Chun Lee, Portland, OR (US); Jad B. Rizk, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/436,382

(22) Filed: Mar. 30, 2012

(51) Int. Cl.
*G01R 19/00* (2006.01)

(52) U.S. Cl.
USPC .......................................................... 327/51

(58) Field of Classification Search
USPC ............. 327/50, 51, 427, 535, 536, 538–541, 327/543; 320/166, 167; 341/118, 120, 136, 341/144
See application file for complete search history.

(56) References Cited

U.S. PATENT DOCUMENTS 7,450,921 B2 * 11/2008 Arayashiki et al. ........... 455/260
8,059,748 B2 * 11/2011 See et al. ...................... 375/296

* cited by examiner

*Primary Examiner* — Lincoln Donovan
*Assistant Examiner* — Sibin Chen
(74) *Attorney, Agent, or Firm* — Schwabe, Williamson & Wyatt, P.C.

(57) ABSTRACT

Embodiments of a calibration circuit for a current source which may include a first control switch, a second control switch, and a capacitor. In embodiments, the first control switch may be operable to couple the capacitor to the current source and the second control switch may be operable to couple the capacitor to a reference current source to enable the capacitor to be charged or discharged according to a first control signal provided to the first control switch and a second control signal provided to the second control switch. In embodiments, the calibration circuit may be included in a digital-to-analog (DAC) converter.

19 Claims, 3 Drawing Sheets

CALIBRATION CIRCUIT APPARATUS AND METHOD

TECHNICAL FIELD

This disclosure relates generally to electronic circuits. More particularly, but not exclusively, the present disclosure relates to a calibration circuit for a current source in a device, such as for example, a digital-to-analog (DAC) converter.

BACKGROUND INFORMATION

A digital-to-analog converter (DAC) is a device that converts an input digital code/signal into an analog signal. One of the most popular DAC architectures includes the current-steering DAC, which has a fast response rate and is thus frequently used in wireless applications. Conventional current-steering DACs include current sources or cells built with transistors that provide binary-weighted currents. Unfortunately, transistors may often have random mismatch characteristics, thereby causing a negative effect on performance.

The current error (or difference) due to a mismatch characteristic of transistors may be related to the current flowing through the transistors and directly inversely proportional to the square root of a transistor size (Width*Length). Thus, in order to minimize an effect of the mismatch characteristic and to provide adequate performance for the DAC, a large transistor size and/or large current may be adopted, which unfortunately increases a size and power consumption of the circuit. Other solutions include replacing conventional full binary architecture current-steering DACs, with circuit architectures that can be calibrated, e.g., full unary (thermometer code) or segmented architecture (a combination of unary and binary architecture). Unfortunately, a full unary or segmented architecture can increase an area of the circuit. Furthermore, various calibration techniques for the full unary or segmented architecture may use a highly precise comparator or a high-resolution analog-to-digital converter (ADC), such as for example, a sigma-delta ADC or Successive Approximation converter (SAR ADC), thereby adding to the complexity and/or area of the circuit.

BRIEF DESCRIPTION OF THE DRAWINGS

Non-limiting and non-exhaustive embodiments are described with reference to the following figures, wherein like reference numerals refer to like parts throughout the various views unless otherwise specified.

FIGS. 1(a)-1(c) are example signal/voltage diagrams associated with the operation of the calibration circuit of FIG. 1, in accordance with one embodiment.

DETAILED DESCRIPTION

Embodiments of a circuit for calibrating a current source are described herein. In embodiments, the current source may be included in a device such as, for example, a digital-analog-converter (DAC) or other device including multiple current sources. In embodiments, the device may include circuitry expected to provide one or more currents according to a particular ratio. In embodiments, the circuit may include a first control switch, a second control switch, and a capacitor, which are configured to allow the first control switch to couple the capacitor to a current source and the second control switch to couple the capacitor to a reference current source to enable the capacitor to be charged or discharged according to a first control signal provided to the first control switch and a second control signal provided to the second control switch.

In the following description, numerous specific details are given to provide a thorough understanding of embodiments. The embodiments can be practiced without one or more of the specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Various calibration techniques attempt to correct current mismatch between current sources or current cells to allow a reduction in an area occupied by DAC or device current cells. However, as noted above, many of the calibration techniques can calibrate only unary current cells controlled by a thermometer code. Embodiments described herein may not only alleviate a current mismatch in a DAC with unary current cells, but may also be compatible with a conventional full binary DAC architecture. In various embodiments, neither a high-resolution ADC nor a highly precise comparator may be necessary, thereby allowing a reduction in utilization of silicon area and power.

Figure 1:
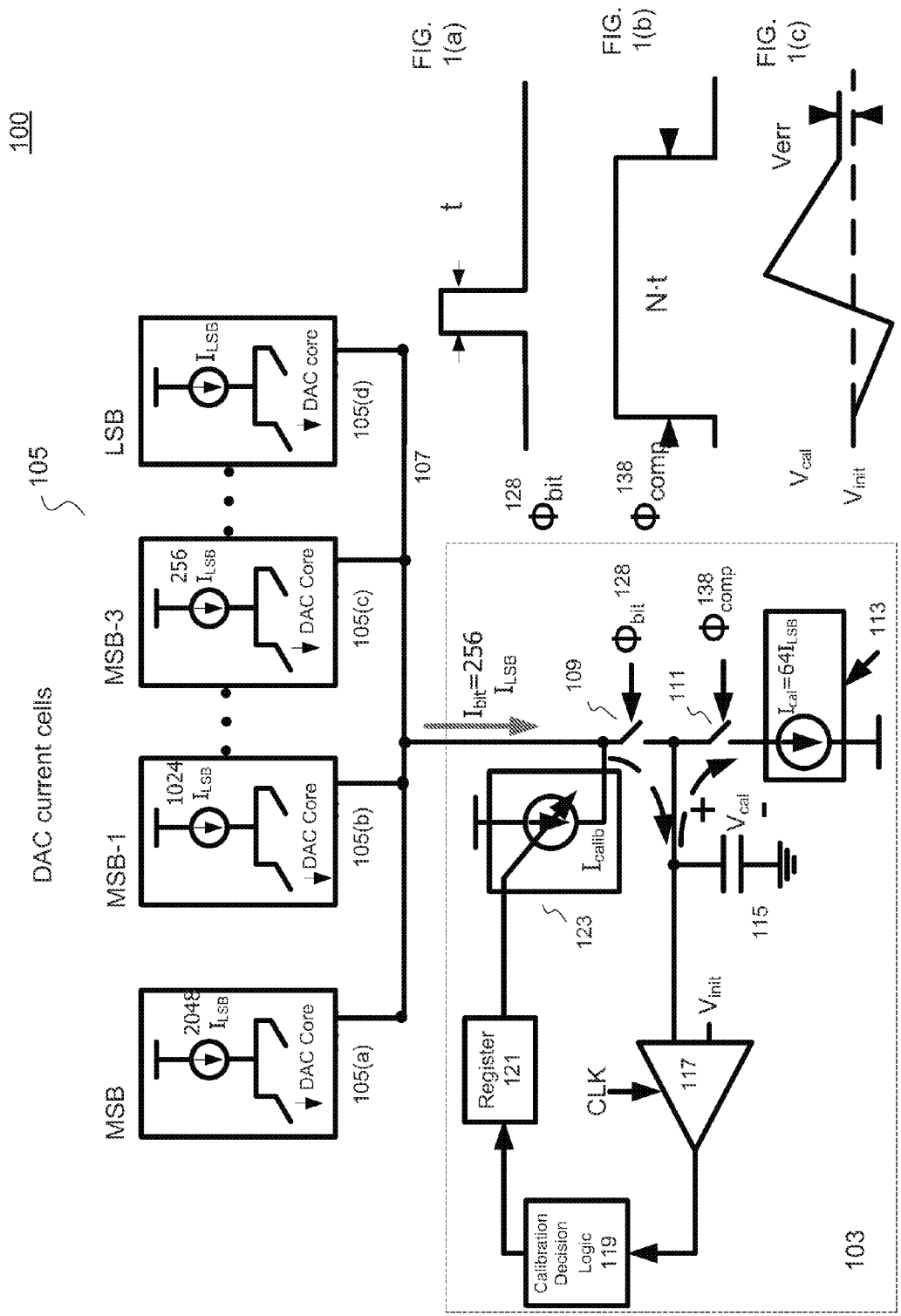
FIG. 1 illustrates an apparatus including a calibration circuit in accordance with one embodiment.

FIG. 1 illustrates an embodiment of a portion of a device 100 including a calibration circuit 103 for calibrating one of a plurality of device current sources or current cells 105 coupled via link or bus 107 to a DAC core or device core (not shown). In the embodiment, device 100 may include a 12-bit DAC including calibration circuit 103 having a first control switch 109, a second control switch 111, and a capacitor 115. In embodiments, calibration circuit 103 may also include a reference current cell 113 and a calibration or compensation current cell 123 coupled to one or more comparators 117, calibration decision logic 119, and register 121. Note that in embodiments, calibration circuit 103 may be shared by each of plurality of current cells 105. In an embodiment, calibration circuit 103 may calibrate one current cell of plurality of current cells 105 at a time.

Note that, in embodiments, an n-bit device (or n-bit DAC) has a plurality of device current cells ("current cells") including n current cells, one for each bit in a digital input code. Example device 100 is a 12-bit DAC and may have twelve current cells, each associated with a respective bit position of a digital input code, from a Most Significant Bit (MSB) to a Least Significant Bit (LSB) However, for simplification of FIG. 1, only four current cells 105(a)-105(d), are illustrated. In the example of FIG. 1, current cells 105(a), 105(b), 105(c), and 105(d), may receive or otherwise correspond to a bit located at a respective MSB, MSB-1, MSB-3, and LSB position of a digital input code.

In embodiments, calibration circuit 103 may implement a time-domain calibration method configured to correct a current mismatch by measuring accumulated charge in capacitor 115. In embodiments, first control switch 109 may be operable (such as by closing) to couple capacitor 115 to one of plurality of current cells 105 and second control switch 111 may be operable (such as by closing) to couple capacitor 115 to reference current cell 113 to enable capacitor 115 to be respectively charged and discharged according to a first control signal $\Phi_{bit}$ 128 ("$\Phi_{bit}$ 128") provided to first control switch 109 and a second control signal $\Phi_{comp}$ 138 ("$\Phi_{comp}$ 138") provided to second control switch 111. Note that in alternative embodiments, a location of one of the plurality of current cells 105 and reference current cell 113 can be switched. Thus, in an alternative embodiment, one of the plurality of current cells 105 may discharge capacitor 115 and reference current cell 113 may charge capacitor 115.

Accordingly, in an embodiment, device 100 is shown during a calibration phase of current cell 105(c). In the embodiment, example current cell 105(c) may be an MSB-3 current cell configured to provide an $I_{bit}$ current of 256 $I_{LSB}$, which may be four times larger than a current $I_{cal}$, provided by reference current cell 113, of 64 $I_{LSB}$. Accordingly, in embodiments, an on-time duration ratio between $\Phi_{bit}$ 128 and $\Phi_{comp}$ 138 may be set to a 1 to 4 ratio, so that the 256 $I_{LSB}$ will charge the capacitor 115 for an on-time duration of t while the $I_{cal}$ of 64 $I_{LSB}$ may discharge the capacitor for an on-time duration of 4t. Thereafter, there may be an expected charge of zero or in some embodiments, $V_{init}$, in capacitor 115 after a calibration cycle. In an embodiment, any current mismatch between current cell 105(c) and reference current cell 113 may result in an error voltage $V_{err}$ across capacitor 115 due to extra positive or negative charge left in capacitor 115.

In embodiments, if t is the on-time duration of $\Phi_{bit}$ 128, then the on-time duration of $\Phi_{comp}$ 138 may be set to (N*t), where:

$$N = I_{bit}/I_{cal}$$

Where $I_{bit}$ may be a current provided by a current cell associated with a bit position as shown in FIG. 1 and may be equivalent to 2048 $I_{LSB}$, 1024 $I_{LSB}$, 512 $I_{LSB}$, 256 $I_{LSB}$, ... $I_{LSB}$ respectively for bit position MSB, MSB-1, MSB-2, MSB-3 ..., LSB. Thus, in embodiments, the on-time duration ratio of $\Phi_{bit}$ 128 to $\Phi_{comp}$ 138 may be set as inversely proportional to a ratio of current provided by current cell 105(c) and the current provided by the reference current cell 113. To further illustrate, FIGS. 1(a), 1(b), and 1(c) are diagrams showing respective $\Phi_{bit}$ 128, $\Phi_{comp}$ 138, and voltage over capacitor 115 ($V_{cal}$) over time, where for this particular example if $I_{bit}$=256 $I_{LSB}$, $I_{cal}$=64 $I_{LSB}$, and N=4. Also note that in embodiments, N may be an integer or a fractional number depending on a respective amplitude of $I_{bit}$ and $I_{cal}$. Thus, if $I_{bit}$ is greater than $I_{cal}$, N is an integer and if $I_{bit}$ is less than $I_{cal}$, N is a fractional number.

Note that in embodiments, in FIGS. 1(a) and 1(b), when either one of $\Phi_{bit}$ 128 or $\Phi_{comp}$ 138 are indicated as low, an associated switch may be off, and thus, open. Conversely, when either one of $\Phi_{bit}$ 128 or $\Phi_{comp}$ 138 is indicated by the line as high, an associated switch may be closed, and thus on. Accordingly, in the embodiment, when $\Phi_{comp}$ 138 initially goes high in FIG. 1(b), capacitor 115 may be discharged by reference current cell 113 as seen by $V_{cal}$ which dips below an initial voltage, $V_{init}$ in FIG. 1(c). Accordingly, a short time later, $\Phi_{bit}$ 128, as shown in FIG. 1(b) may go high for a duration of t, allowing capacitor 115 to begin charging, as shown by rising $V_{cal}$. During embodiments, when $\Phi_{bit}$ 128 returns to low while $\Phi_{comp}$ 138 remains high, capacitor 115 may again discharge until $\Phi_{comp}$ 138 returns to zero at a later time. Accordingly, in embodiments, capacitor 115 may discharge to allow one or more comparators 117 coupled to an output of capacitor 115 detect $V_{err}$ by comparing an accumulated charge $V_{cal}$ in capacitor 115 to a reference voltage or initial voltage, $V_{init}$. Note that, in embodiments, accumulated charge may be presented as $V_{cal}$ based on the equation $V_{cal}$=Q/C, where Q is charge in capacitor 115 and C is capacitance.

In the embodiment, one or more comparators 117 may then generate an output or digital signal and provide the output to calibration decision logic 119. Based on the output, in embodiments, calibration decision logic 119 may determine a mismatch condition of current cell 105(c). In embodiments, data related to the mismatch condition may be provided to and stored in register 121.

In embodiments, data related to the mismatch condition may include a control signal configured to trigger compensation current cell 123 to compensate for a current difference between current cell 105(c) and reference current cell 113. Thus, in embodiments, calibration logic decision 119 may generate a control signal to instruct compensation current cell 123 to provide a reduced or increased current $I_{calib}$ until $V_{err}$ returns to zero. In embodiments, register 121 may store the control signal as associated with current cell 105(c) for future operations.

As illustrated above, the on-time duration of $\Phi_{bit}$ 128 and $\Phi_{comp}$ 138 may be adjusted according to an inverse expected ratio between the current cell under current cell 105(c) and reference current cell 113. As noted above and as shown in FIG. 1, since currents provided by plurality of current cells 105 are binary weighted, $I_{bit}$ of current cell 105(a) has a value of 2048 $I_{LSB}$ due to its association with an MSB position. Current cell 105(b) may be associated with an MSB-1 position, and have a value of 1024 $I_{LSB}$, while a next current cell associated with an MSB-2 position, may have a value of 256 $I_{LSB}$ (not shown), and so forth. Accordingly, in embodiments, from MSB to MSB-6, the on-time duration of $\Phi_{comp}$ 138 may continue to be reduced until the on-time duration of $\Phi_{comp}$ 138 is equal to the on-time duration of $\Phi_{bit}$ 128. In accordance with an inverse expected ratio between a current cell associated with MSB-7 and reference current cell 113, in embodiments, rather than reducing the on-time duration of $\Phi_{comp}$ 138, the on-time duration of $\Phi_{bit}$ may be increased while the on-time duration of $\Phi_{comp}$ 138 remains the same.

Figure 2A:
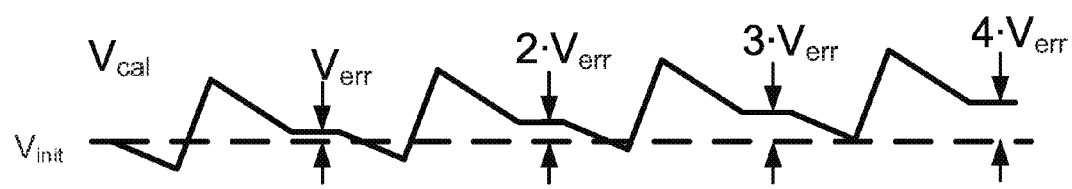
FIGS. 2A and 2B respectively show example error voltage accumulation and voltage threshold diagrams associated with the operation of the calibration circuit of FIG. 1, in accordance with one embodiment.
Figure 2B:
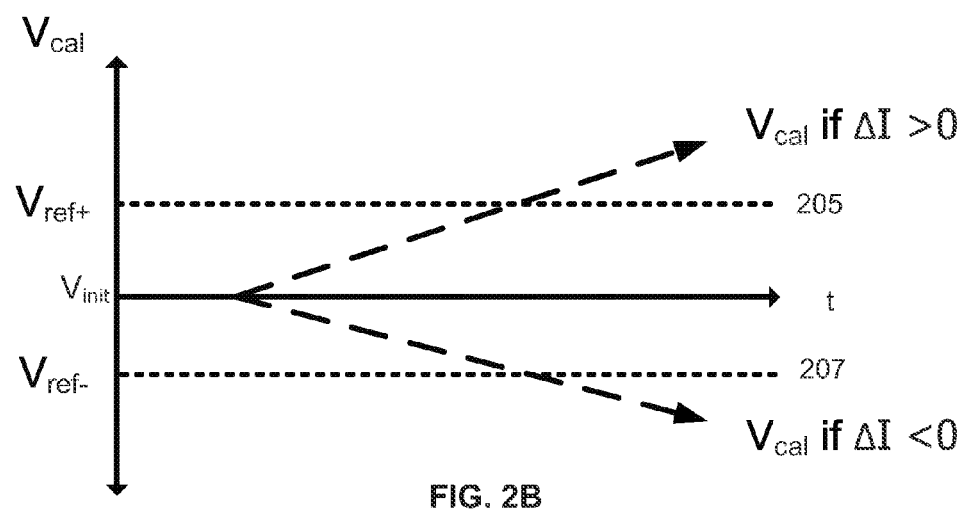

In embodiments, a calibration cycle may include a plurality of charge comparisons that occur prior to triggering compensation current cell 123 to compensate for the current mismatch or current difference. Once compensation current cell 123 is instructed to compensate for the current difference, calibration circuit 103 may begin a next calibration cycle, in an embodiment. In embodiments, in the next calibration cycle, calibration circuit 103 may determine whether compensation current cell 123 added a correct amount of current for compensation. In embodiments, calibration circuit 103 may perform one or more calibration cycles during a calibration of current cell 105(c) prior to beginning a calibration of a next current cell. Accordingly, FIG. 2A illustrates $V_{cal}$ over time as charge accumulates in capacitor 115 accompanied by FIG. 2B which illustrates a relationship between $V_{cal}$ and an upper threshold $V_{ref+}$ 205 and a lower threshold $V_{ref-}$ 207 for performing the plurality of charge comparisons where ΔI in FIG. 2B may be a current difference between an expected current and an actual current of the current cell 105(c) under calibration. In embodiments, the plurality of charge comparisons may be performed by a first and a second comparator according to respective $V_{ref+}$ 205 and $V_{ref-}$ 207.

Thus, in an embodiment, as described in connection with FIG. 1, if $I_{bit}$ is larger than expected, capacitor 115 may generate a positive error voltage $V_{err}$. In embodiments, as a plurality of subsequent comparisons are performed, $V_{cal}$ may increase until eventually moving across upper threshold $V_{ref+}$ 205. If $V_{cal}$ moves across $V_{ref+}$ 205, calibration decision logic 119 may then make a decision to cause a decrease in $I_{calib}$ to compensate for the current difference. In embodiments, calibration circuit 103 may begin a second calibration cycle and the first comparator may perform an additional one or more comparisons to determine if a correct amount of current for compensation was applied. In embodiments, after a plurality of comparisons, once $V_{cal}$ no longer crosses $V_{ref+}$ 205, the calibration of current cell 105(c) may be complete. In embodiments, calibration circuit 103 may perform a plurality of comparisons that may include 400 comparisons before determining that $V_{cal}$ no longer crosses $V_{ref+}$ 205.

Similarly, in another embodiment, if $I_{bit}$ is less than expected, accumulated $V_{cal}$ moves in a negative direction and after multiple comparisons $V_{cal}$ may move across lower threshold $V_{ref-}$ at 207. A similar scenario may occur as that described above, except, in embodiments, the comparisons will occur with respect to $V_{ref-}$ 207.

As noted above, in an embodiment, calibration circuit 103 may calibrate one current cell of plurality of current cells 105 at a time. In an embodiment, an order of calibration may proceed from a current cell associated with an MSB to a current cell associated with an LSB of the digital input code. In other embodiments, the order of calibration may proceed from a current cell associated with an LSB to a current cell associated with the MSB of the digital input code. In embodiments, a digital control circuit may determine which current cell of plurality of current cells 105 will be a next current cell to be calibrated.

Note that in embodiments, calibration circuit 103 may calibrate not only mismatches between each of a plurality of current cells 105 but also an offset of reference current cell 113. In embodiments, a digital average cancellation algorithm can simply cancel out the offset of reference current cell 113. In embodiments, an average function may be performed using the stored control signals of compensation current cell 123 in a register mapping to one or more of plurality of current cells 105. In embodiments, the stored control signals may subtract an averaged value, alleviating an effect of the offset from reference current cell 113.

Figure 3:
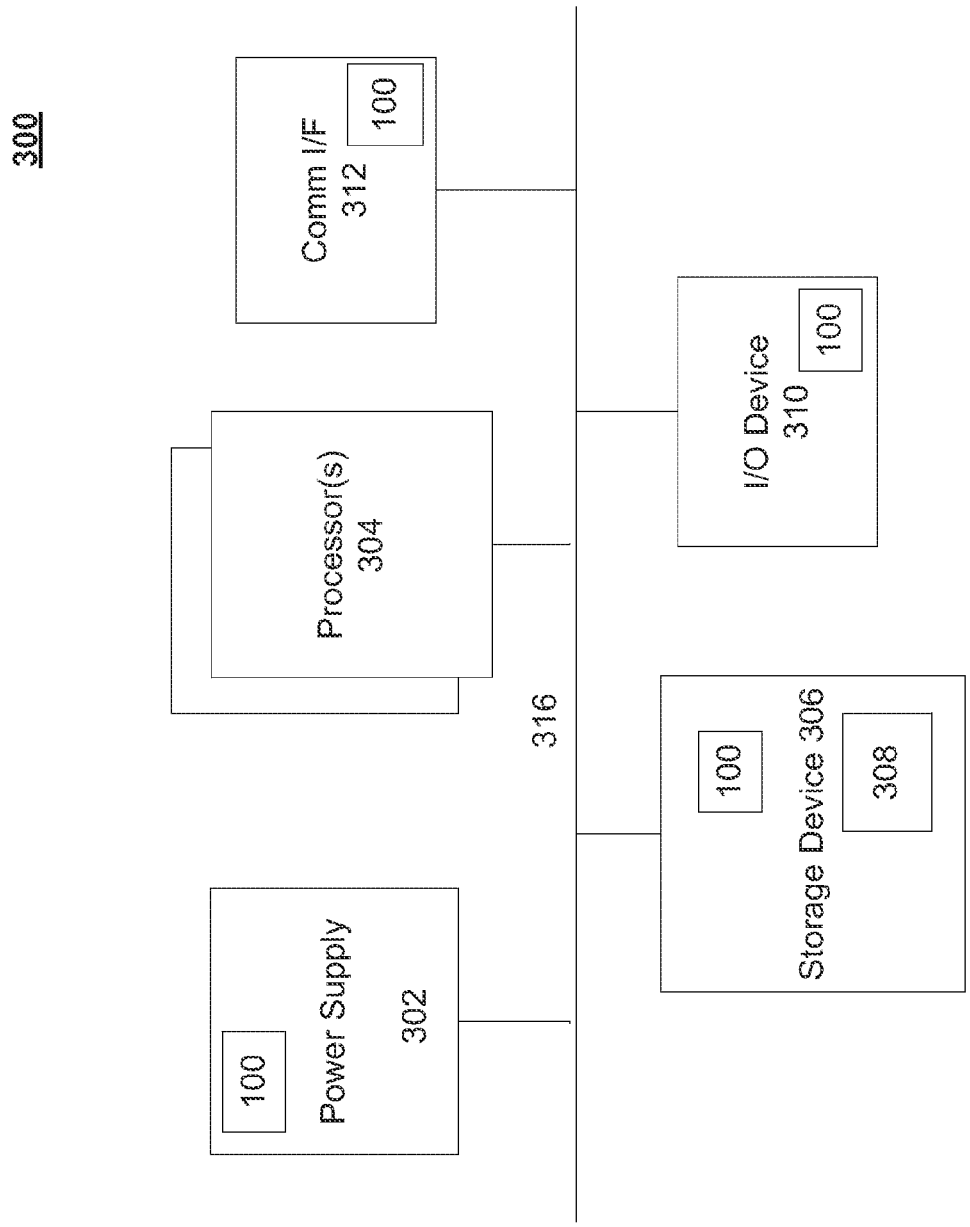
FIG. 3 is a block diagram that illustrates an example computer system suitable to practice the disclosed calibration circuit and method of various embodiments.

Referring now to FIG. 3, which is a block diagram that illustrates an example computer system 300 suitable to practice the disclosed calibration circuit/method of various embodiments. As shown, the computer system 300 may include a power supply unit 302, a number of processors or processor cores 304, a storage device 306 having computer-executable such as processor-readable and processor-executable instructions 308 stored therein, and a communication interface 312. The computer system 300 may also comprise input/output devices 310 (such as a keyboard, display screen, cursor control, and so forth). In embodiments, power supply unit 302, storage device 306, as well as I/O device 310 may include a calibration circuit 103 included in a device 100. In embodiments, device 100 may be a current-steering DAC or other DAC of suitable architecture for converting digital input code to an analog signal. For the purpose of this application, including the claims, the terms "processor" and "processor cores" may be considered synonymous, unless the context clearly requires otherwise.

The one or more storage devices 306 may comprise a tangible, non-transitory computer-readable storage device (such as a diskette, hard drive, compact disc read only memory (CDROM), hardware storage unit, and so forth). In embodiments, the one or more storage devices 306 may be a main memory. In embodiments, calibration circuit 103 may also be included in a device 100 alternatively or additionally located in or coupled to communication interface 312. In embodiments, a Radio Frequency Integrated Circuit (RFIC) chip or communication chip may include calibration circuit 103. The various elements of FIG. 3 may be coupled to each other via a link or communication pathway 316, which represents one or more pathways. In some embodiments, communication pathway 316 may be a system bus. In the case of multiple buses, they may be bridged by one or more bus bridges (not shown).

The storage device 306 may in some embodiments be a main memory. In some embodiments, storage device 306 may be employed to store a working copy and a permanent copy of programming instructions implementing one or more operating systems, firmware modules or drivers, applications, and so forth, herein collectively denoted as 308. The permanent copy of the programming instructions may be placed into permanent storage in the factory, or in the field, through, for example, a distribution medium (not shown), such as a compact disc (CD), or through the communication interface 312 (from a distribution server (not shown)).

According to various embodiments, one or more of the depicted components of the system 300 and/or other element(s) may include a keyboard, LCD screen, non-volatile memory port, multiple antennas, graphics processor, application processor, speakers, or other associated mobile device elements, including a camera. The remaining constitution of the various elements of the computer system 300 is known, and accordingly will not be further described in detail. In some embodiments, at least one of processor(s) 304 may be integrated on a same die with one or more other components of system 300. In embodiments, the one or more processors may be configured to execute stored computer-executable instructions stored in storage device 306.

The above description of illustrated embodiments, including what is described in the Abstract, is not intended to be exhaustive or to be limited to the precise forms disclosed. While specific embodiments and examples are described herein for illustrative purposes, various modifications are possible. The terms used in the following claims should not be construed to be limited to the specific embodiments disclosed in the specification.

What is claimed is:

1. A circuit for calibrating a current source, comprising:
a first control switch;
a second control switch;
a capacitor, wherein the first control switch is operable to couple the capacitor to the current source and the second control switch is operable to couple the capacitor to a reference current source to enable the capacitor to be charged or discharged according to a first control signal provided to the first control switch and a second control signal provided to the second control switch; and
a calibration current source configured to provide a current, based on a difference between an accumulated charge in the capacitor and an expected charge in the capacitor, to compensate for a difference between the current source and the reference current source.

2. The circuit of claim 1, wherein a ratio of an on-time duration of the first control signal to an on-time duration of the second control signal is determined according to a ratio of a current of the current source to a current of the reference current source.

3. The circuit of claim 2, wherein the ratio of the on-time duration of the first control signal to the on-time duration of the second control signal is inversely proportional to the ratio of the current of the current source to the current of the reference current source.

4. The circuit of claim 1, wherein the expected charge of the capacitor is an expected initial charge set prior to the charge or discharge of the capacitor.

5. The circuit claim 1, further comprising a comparator coupled to an output of the capacitor to compare the accumulated charge in the capacitor to the expected charge in the capacitor.

6. The circuit of claim 5, further comprising decision logic coupled to the comparator to receive a digital signal from the output of the comparator.

7. The circuit of claim 6, further comprising a register, coupled to an output of the decision logic, to store data related to a mismatch condition of the current source.

8. The circuit of claim 7, wherein the calibration current source is coupled to an output of the register and the first control switch.

9. An apparatus, comprising:
a plurality of current sources;
a calibration circuit, coupled to the plurality of current sources, to calibrate a first current source of the plurality of current sources, wherein the calibration circuit includes:
a reference current source;
a capacitor coupled to the reference current source and the first current source, wherein the first current source is coupled to the capacitor via a first control switch and the reference current source is coupled to the capacitor via a second control switch to allow the capacitor to be charged or discharged according to a first control signal of the first control switch and a second control signal of the second control switch; and
a first and a second comparator coupled to an output of the capacitor.

10. The apparatus of claim 9, wherein a ratio of an on-time duration of the first control signal to an on-time duration of the second control signal is determined according to a ratio of a current of the current source to a current of the reference current source.

11. The apparatus of claim 9, wherein the calibration circuit further comprises a calibration current source, coupled to the first control switch and the second control switch, to supply a current based at least in part on an amount of charge accumulated in the capacitor after a charge and discharge of the capacitor.

12. The apparatus of claim 11, wherein the calibration circuit further includes a register coupled to the calibration current source.

13. The apparatus of claim 9, wherein the apparatus comprises a digital-to-analog converter.

14. A method, comprising:
charging a capacitor via a first current source according to a first control signal controlling a first on-time duration of a first control switch;
discharging the capacitor via a second current source according to a second control signal controlling a second on-time duration of a second control switch;
determining an amount of charge remaining in the capacitor after the charging and the discharging of the capacitor; and
determining a compensation current, based on a difference between the amount of charge remaining in the capacitor and an expected charge in the capacitor, to compensate for a difference between the first current source and the second current source.

15. The method of claim 14, wherein determining the amount of charge remaining in the capacitor includes performing a comparison by one or more comparators coupled to an output of the capacitor.

16. The method of claim 14, further comprising setting a ratio of an on-time duration of the first control switch to the on-time duration of the second control switch as inversely proportional to a ratio of a current provided by the first current source to the current provided by the second current source.

17. A system, comprising:
a memory having computer-executable instructions stored thereon;
a processor coupled to the memory and configured to execute the stored computer-executable instructions to cause a generation of a digital signal; and
a communication interface coupled to the processor, the communication interface including a device to convert the digital signal to an analog signal, wherein the device includes a circuit to calibrate a current source of the device, the circuit including:
a first control switch;
a second control switch; and
a capacitor, wherein the first control switch is operable to couple the capacitor to the current source and the second control switch is operable to couple the capacitor to a reference current source to enable the capacitor to be charged or discharged according to a first control signal provided to the first control switch and a second control signal provided to the second control switch; and
a calibration current source configured to provide a compensation current, based on a difference between an accumulated charge in the capacitor and an expected charge in the capacitor, to compensate for a difference between the current source and the reference current source.

18. The system of claim 17, wherein the circuit further includes a first and a second comparator coupled to an output of the capacitor.

19. The system of claim 17, further comprising decision logic configured to determine a mismatch condition of the current source.

* * * * *